United States Patent [19]
Leenders et al.

[11] Patent Number: 4,710,444
[45] Date of Patent: Dec. 1, 1987

[54] PROCESS FOR THE FORMATION OF LINEWORK OR HALFTONE MULTICOLOR COLLOID PATTERNS

[75] Inventors: Luc H. Leenders; Eddie R. Daems, Herentals; Jan A. Van den Bogaert, Schilde, all of Belgium

[73] Assignee: AGFA-Gevaert N.V., Mortsel, Belgium

[21] Appl. No.: 824,081

[22] Filed: Jan. 30, 1986

[30] Foreign Application Priority Data

Feb. 4, 1985 [EP] European Pat. Off. ........ 85101127.0

[51] Int. Cl.⁴ .......................... G03C 5/54; G03C 7/22
[52] U.S. Cl. .................................... 430/237; 430/202; 430/236; 430/257; 430/952
[58] Field of Search .............. 430/202, 236, 237, 257, 430/222, 264, 952

[56] References Cited

U.S. PATENT DOCUMENTS

| 3,364,024 | 1/1968 | Yackel et al. | 430/202 |
| 3,642,474 | 2/1972 | Verelst et al. | 430/257 |
| 3,721,557 | 3/1973 | Inoue | 430/952 |
| 4,363,864 | 12/1982 | Rutledge | 430/202 |
| 4,427,757 | 1/1984 | Beebe et al. | 430/306 |
| 4,504,572 | 3/1985 | Beruto et al. | 430/202 |

FOREIGN PATENT DOCUMENTS 2220812 4/1974 France .
554298 6/1943 United Kingdom .
2130397 5/1984 United Kingdom .

Primary Examiner—Richard L. Schilling
Attorney, Agent, or Firm—William J. Daniel

[57] ABSTRACT

Process for forming a halftone multicolor pattern which comprises in sequence given the following steps:
(1) scanningwise exposing a multicolor original attached to a rotating scanner drum to produce series of electrical signals that are fed into a computer,
(2) exposing in a single scan separate black-and-white light-sensitive silver halide emulsion layer materials under the control of the computer in accordance with said signals,
(3) developing the exposed silver halide emulsion layers with a hardening or tanning developing agent producing a negative or positive silver selection image that can be used as intermediate original in the production of a printing plate, a pattern of oxidized hardening developing agent being imagewise transferred during development from the emulsion layer onto a hardenable non-photosensitive colored gelatin layer originally carried on a temporary support or carried directly on a permanent support,
(4) producing a colored relief image by wash-off processing of said colored gelating layer, and
(5) assembling the colored relief images into a multicolor pattern on the same permanent support.

11 Claims, No Drawings

PROCESS FOR THE FORMATION OF LINEWORK OR HALFTONE MULTICOLOR COLLOID PATTERNS

The present invention relates to a process for the formation of linework or halftone multicolour colloid patterns.

The production of linework or halftone multicolour colloid patterns is of interest in the field of design, e.g. in the production of colour decorative patterns, colour wiring and circuit diagrams, cartography, colour proofing and the preparation of transparencies for projection, optionally opaque prints for overhead projection.

Especially in the colour field of the graphic art there is a great need for a simple and fast technique offering "colour proofs" of high quality and reproducibility.

Photographically produced colour proofs are a substitute for multicolour halftone reproductions as will be produced by successive printing in register with the separate standard inks: magenta, yellow, cyan and black on a conventional printing press. The production of colour proofs by preparing a printing plate and actually running the plate on the press to produce only a few copies to determine the quality of the halftone separation transparencies used in the exposure is a very expensive procedure and therefore photographic processes have been developed to obtain a similar result by means of which the appearance of a print starting from particular colour separation negatives or positives can be judged by the printer and client.

According to a process known from U.S. Pat. No. 3,642,474 the production of such a proof in the form of superposed coloured colloid patterns, proceeds with hydrophilic coloured colloid layers, which are hardened in the irradiated portion by means of an active species formed during or after the informationwise exposure to active electromagnetic radiation of a photosensitive substance, and comprises the following steps:

(1) transferring onto a permanent support from a relatively more hydrophobic temporary support a coloured hydrophilic colloid layer containing a photosensitive substance and a hydrophilic colloid, which layer upon exposure undergoes a reduction in solubility in water by said active species, by pressing the latter in the presence of an aqueous liquid against said colloid layer, and removing the temporary support, thus leaving the layer on the permanent support;

(2) exposing the transferred colloid layer in substantially dry state to active electromagnetic radiation, which is modulated according to the information to be recorded, (3) developing the exposed layer by means of an aqueous liquid followed by wash-off processing to form a coloured relief pattern, and repeating the steps (1), (2) and (3) with additional hydrophilic colloid layers having a colour as desired to produce superposed coloured colloid patterns on the permanent support.

In this process for producing a multicolour pattern the exposures proceed in registration on the same permanent support which received the unexposed coloured hardenable colloid layers by transfer from a temporary support, each transfer and exposure being followed by hardening development, wash-off processing and a drying step before the next transfer and exposure leading to another selected colour pattern can be carried out.

In the above process for the production of colour proofs the imagewise exposure proceeds in a vacuum frame with the particular separation negative of the multicolour pattern to be reproduced in contact with the coloured colloid layer on the permanent support.

In U.S. Pat. No. 3,364,024 a photographic process is described for obtaining a photographic resist image by the transfer of certain diffusing gelatin-insolubilizing oxidized developing agents from a developing silver halide emulsion layer to a separate non-silver halide containing gelatin layer thereby imagewise insolubilizing therein the gelatin.

According to an embodiment the silver halide emulsion layer during development is contacted with a pigmented gelatin layer on a separate support for a time sufficient for the oxidation products of the developer to harden the gelatin imagewise. When unhardened portions are removed by wash-off processing, a pigmented relief image remains.

Tanning developing agents useful for said process are for example, 1,4-dihydroxy benzene compounds such as hydroquinone, chlorohydroquinone, bromohydroquinone, toluhydroquinone and morpholine methyl hydroquinone.

In the graphic art field an increasing proportion of colour work is now made on colour scanners.

Colour scanners operate with a rotating scanner drum and in many instances with a laser light source of a definite narrow spectral composition. Therefore, scanningwise exposure requires photographic materials with a specific photosensitivity. Moreover, in order to have an economic use of the scanner the sequence of exposure and processing steps has to be such that the scanner can operate without interruptions.

According to the basic principles of a colour scanner a light spot from a non-modulated light source inside or outside a rotating drum is used to expose in transmission or reflection an original attached to the drum. The light beam of the spot modulated by the original is picked up by three photocells after passing through red, green and blue filters respectively. The amounts of red, green and blue light, and the resulting photocell responses, represent the colour of the original at this point. A computer operates on these signals to calculate the light output of the light source, e.g. argon ion laser light source, for the exposure of the proper photographic film in the production of the cyan, magenta, yellow and black colour selection. Scanning-exposure is inherently time consuming, e.g. takes up to about 10 minutes for a single DIN A4 size selection being scanned at 140 lines per cm.

The preparation of overlay colour proofs by scanningwise exposure on separate supports starting from non-transferable pigmented silver halide gelatin coatings is described in U.S. Pat. No. 4,427,757 but yields inferior results because of poor rendition of white regions due to the inherent light absorption of the plurality of overlaying supports and the disturbing light-reflection effects obtained on each interlaying support.

The above sequence of processing steps as defined in U.S. Pat. No. 3,642,474 is not practical and is time consuming when for the imagewise exposures a scanner is used. Indeed, the above process is less suited to be combined with scanner-exposure from the viewpoint of sensitivity, convenience and rapid accessibility to the final multicolour reproduction because the scanner is not occupied full time. Each scanning operation would be interrupted by a wet hardening development, a wash-off processing and drying of a freshly transferred coloured colloid layer.

Since a scanner operates with fairly poor light-output and with limited spectral composition when a laser light source is used, it is not possible to process effectively poorly photosensitive photographic materials such as those based on the UV-sensitive iron(III) complexes described in the already mentioned U.S. Pat. No. 3,642,474.

It is an object of the present invention to provide a process for the formation of a line or halftone multicolour colloid pattern wherein the scanningwise exposure of several pigment-free photographic silver halide emulsion materials proceeds on a scanner without interruption by intervening processing steps and provide exposed photographic materials which can be used in the production of a multicolour colloid pattern in conjunction with separate coloured non-lightsensitive materials.

It is a further object of the present invention to provide a colour proofing process wherein a multicolour proof and black-and-white selection negatives or positives images are formed in a common procedure, said selection images being suited for serving as originals in the exposure of photosensitive printing plates.

Other objects and advantages of the present invention will become clear from the further description.

In accordance with the present invention the process for forming a line or halftone multicolour colloid pattern comprises the following steps:

(1) scanningwise exposing a multicolour original attached to a rotating scanner drum to obtain separate red light, green light and blue light output signals received by photon-detectors to produce corresponding electrical signals, which are fed into a computer, (2) exposing under the control of the computer and in accordance with the respective signals, preferably in a single scan operation, separate black-and-white photographic silver halide emulsion layer materials, (3) developing one of the exposed silver halide emulsion layer materials with a hardening developing agent, and during development contacting the emulsion layer side of the photographic material with a hardenable non-photosensitive gelatin-containing layer coloured with diffusion resistant coloured substances, which layer prior to contact with the photographic material emulsion had been transferred from a temporary support to a permanent support to selectively harden regions of said coloured layer, and (4) removing the non-hardened regions of the coloured gelatin containing layer by wash-off or transfer processing to leave a coloured relief image on the permanent support, or (3') developing one of the exposed silver halide emulsion layer materials with a hardening developing agent, and during development effecting the imagewise transfer of oxidized hardening developing agent from said developing silver halide emulsion layer to a hardenable non-photosensitive gelatin containing layer that is coloured with diffusion-resistant coloured substances and is present on a temporary support to selectively harden regions of said colored layer, and (4') removing the non-hardened regions of the coloured gelatin containing layer by wash-off processing to leave a coloured relief image on the temporary support and then transferring the residual relief regions onto a permanent support by pressing the relief portions in dry state, optionally in the presence of heat, onto a permanent support and removing the temporary support, and (5) producing a multicolour pattern on the same permanent support by repeating the steps (3) and (4) or the steps (3') and (4'), with at least one other scanningwise exposed photographic silver halide emulsion layer material and colored non photosensitive layer, wherein in steps (3) and (4) the imagewise transfer of oxidized developing agent takes place in registration, and in steps (3') and (4') the transfer of said relief portions takes place in registration.

The phrase "a single scan operation" shall be understood to mean that the exposure of all the photographic materials used in the multicolour print production proceeds on the same scanner drum by arranging the materials on the drum in adjacent order and effecting the scanning without interrupting the rotation of the drum.

The gelatin of the hardenable coloured layers used according to the present invention is preferably mainly unhardened gelatin as described in U.S. Pat. No. 3,364,024.

According to a preferred embodiment in the transfer of the hardenable coloured gelatin containing layer from a temporary support onto a permanent support a permanent support is used that is less hydrophobic than the temporary support. The transfer proceeds by pressing the permanent support in the presence of an aqueous liquid against the hardenable non-photosensitive gelatin containing layer and removing the temporary support, thus leaving the hardenable gelatin containing layer on said permanent support.

According to a modification of the present process the first hardenable non-photosensitive coloured gelatin layer is not transferred from a temporary support but is carried initially on a permanent support and yields the a first coloured relief image thereon with the other coloured patterns being added one by one from coloured gelatin colloid layers originally present on a temporary support.

In the present process the best results from the viewpoint of image-sharpness are obtained by effecting the scanning-wise exposure of the light-sensitive silver halide material from the front side. Such requires, however, a reverse reading exposure to obtain after transfer of oxidized developing agent right reading copies. In modern scanner exposure apparatus this requirement does not form a problem since the computer software allows electronic image-reversing without special optics such as mirrors and the like.

According to a particular embodiment the present process is carried out with photographic materials comprising on a resin film support, a silver halide emulsion layer incorporating in a hardened or unhardened gelatin binder a silver halide tanning developing agent and photosensitive silver halide grains.

When applying the process according to the present invention including the steps (3') and (4'), the wash-off colored layer on the temporary support includes a top layer or stratum which contains preferably dispersed in the hardenable hydrophiic colloid a substance having pressure and/or heat sensitive adhesive properties, e.g. a thermoplastic polymer in latex form, the surface tack being improved by applying pressure and/or heat. Such substances are described, e.g. in U.S. Pat. No. 4,033,770, which for these substances may be read in conjunction herewith.

The process of the present invention can be applied so as to offer the advantage of producing in one and the same operation selection negatives or positives in the form of developed black-and-white photographic materials and a corresponding multicolour proof. These selection negatives or positives are suited for use as intermediate originals in the exposure of photo-resist printing plates forming the actual monochrome printing forms.

For the production of high quality black-and white selection images the gelatin binder of the silver halide emulsion layer is preferably overall hardened but to an extent still allowing the diffusion of oxidized hardening developing agent out of said layer.

In the production of superposed multicolour colloid patterns the coloured substances used in the hardenable colloid layers have to be resistant to diffusion and chemically inert in the processing and washing liquid as much as possible. When being used in colour proofing they have to match with the absorption spectrum of the standard process inks as close as possible. Particulars about standard colour inks can be found in H. M. Cartwright—Ilford Graphic Arts Manual (1962) Vol. I—pages 502 to 504.

There exist "cold" and "warm" colour standards. Cold colour tones are, e.g. standardized in the U.S.A. in the GATF-Colour Charts and in the German Standards DIN 16508 and 16509. Warm colour tones are standardized, e.g. in the German Standard DIN 16538.

The cold colour standards are characterized by the use of substantially pure magenta dyes, mostly insolubilized rhodamine and phloxine-dyes, which have a very low side-absorption in the blue region of the spectrum.

The warm colour standards are characterized by the use of insolubilized azo dyestuffs. These dyestuffs are more resistant to solvents, e.g. alcohol, than the rhodamines and phloxines, but they possess a much higher side-absorption in the blue region of the spectrum.

It has been found experimentally that pigments, which are insoluble or very poorly soluble in water and in organic liquids of the alcohol or polyhydric alcohol type. e.g. glycerol, fulfil the requirements of resistance to diffusion. Dyes in pigment form that are applied from an aqueous dispersion are used preferably, though the use of substantive dyes, i.e. chemically reactive dyes, that are chemically linked to the hardenable colloid layer material is not excluded. For colour-proofing purposes the hardenable colloid layer should preferably contain coloured substances in a concentration sufficiently high for obtaining an optical density of at least 0.35 in the wavelength range of maximum absorption.

The coloured substances may have all kind of colour, e.g. are cyan, light-cyan, magenta, warm magenta, black, yellow, green, brown, orange, red, white or blue. Considered are likewise metallic colours such as pale gold, rich gold, copper, and silver. In other words the term "colour" in the present invention encompasses all pure and mixed colours as well as black and white.

Non-migratory pigments suitable for use in the present invention are known organic pigments, e.g. those obtainable under the Trade Marks "PIGMOSOL" and "COLANYL" dyes. "PIGMOSOL" and "COLANYL" are organic pigments that are mixed with a dispersing agent for an aqueous medium. These pigments excel in resistance to light, heat, acids, bases, oxidizing agents, and solvents. They are insoluble in hydrophilic colloids such as gelatin.

When in addition to the cyan, magenta and yellow relief patterns a black relief pattern is formed in colour proofing, preferably carbon black is used. Apart from carbon black mixtures of coloured pigments may be applied as described e.g. in U.S. Pat. No. 4,427,757.

According to a special embodiment in order to avoid a direct contact of the coloured substances with the permanent support, the coloured layer on the temporary support is over-coated with a hydrophilic colloid layer (top layer), which is not coloured, i.e. does not contain pigments or dyes for forming the image. On transfer of such composite layer the top layer comes into contact with the permanent support and is sandwiched between said support and the coloured layer. The top layer may contain the same colloid as the coloured layer. The top layer, however, may contain small amounts of translucent pigments, e.g. silica particles, which protrude from the layer and are a few microns thicker than the top layer. They prevent sticking or blocking of rolled up sheet material at relatively high (e.g. 60%) relative humidity. The top layer contains, e.g., 0.2 to 1.5 g of gelatin per sq.m.

In order to obtain images with a good resolution, relatively thin coloured colloid coatings are preferred. Preferably they have a thickness in the range of 1 um and 15 um. Good results are obtained with coloured colloid layers containing 1 to 10 g of gelatin per sq.m. Very good results are obtained with colloid layers having a combined thickness of 1 to 5 um and containing 0.5 to 3 g of gelatin per sq.m. The colloid layers preferably contain at least 50% by weight of gelatin.

The adhering power of each transferable coating or composite coating to its temporary support, preferably a flexible one, should be such that an easy stripping off from the temporary support is possible after pressing the pigment coating into contact with the permanent support. Therefore, a relatively hydrophobic temporary support e.g. an unsubbed cellulose triacetate sheet, a polystyrene sheet, a polyester sheet, or sheet of copoly(vinyl acetate/vinylchloride) and a permanent support having a hydrophilic surface, e.g. a polyethylene terephthalate support subbed for adhering gelatin coatings is used preferably e.g. a hydrophobic support subbed as described in the United Kingdom Patent Specification No. 1,234,755. According to one embodiment the coloured hardenable layer is composed in such a way that its adherence to the temporary support when wet is less than when dry. This can be attained by the addition of hygroscopic agents, e.g. a water-soluble organic hygroscopic compound e.g. glycerol, and the use of wetting and plasticizing agents. Other temporary supports having a repelling power for wet gelatin coatings are, e.g., a paper base coated with a polyethylene layer, a paper base impregnated with wax, a paper base coated with a layer of cellulose nitrate or a paper base coated with a layer of insolubilized polyvinyl alcohol or a layer of alginic acid insolubilized with an alkaline earth metal salt.

The permanent support may be rigid or flexible and need only provide by itself or by means of (a) subbing layer(s) a good adherence when wet as well as when dry for the transferable hydrophilic colloid layer or relief portions thereof.

Depending on the use of the multicolour print the permanent support is transparent, translucent or opaque. So, it is possible to use metal layers or sheets, glass, ceramics, resin supports and paper impermeabilized for the processing and washing liquids.

For purposes such as colour proofing wherein three or more transfers have to be effected in registration it is necessary to use a resin support with high dimensional stability.

Resin supports characterized by a high mechanical strength and very low water-absorption and consequently high dimensional stability in dry and wet state can be formed from a linear polyester, e.g. polyethylene terephthalate.

Good results as to dimensional stability are obtained with aluminium sheets sandwiched between two high wetstrength paper sheets although this material is rather expensive.

Permanent resin supports can be made opaque by coating them with a matted subbing layer or by matting or colouring them in the mass. The matting may be effected by pigments known therefor in the art, e.g. titanium dioxide, zinc oxide, and barium sulphate. Matting can also be obtained by producing a "blushcoat" as described e.g. in United Kingdom Patent Specification No. 943,681.

Hydrophobic resin supports to be used as a permanent support according to the present invention are coated with one or more subbing layers for a gelatin containing layer.

Preferred subbing layers for use on a permanent hydrophobic resin support, e.g. a polyethylene terephthalate support, are described in the aforementioned United Kingdom Patent Specification No. 1,234,755.

The photosensitive silver halide used in the photographic materials applied in the present invention may comprise silver chloride, silver bromide, silver bromoiodide, silver chlorobromoiodide and the like, or mixtures thereof. The silver halide emulsions may be coarse or fine grain and can be prepared by any of the well known procedures, e.g., single jet emulsions, double jet emulsions, such as Lippmann emulsions, ammoniacal emulsions, thiocyanate- or thioether-ripened emulsions such as those described in U.S. Pat. Nos. 2,222,264 of Adolph H. Nietz and Frederick J. Russell, issued Nov. 19, 1940, 3,320,069 of Bernard D. Illingsworth, issued May 16, 1967, and 3,271,157 of Clarence E. McBride, issued Sept. 6, 1966. Surface image emulsions may be used or internal image emulsions may be used such as those described in U.S. Pat. Nos. 2,592,250 of Edward Philip Davey and Edward Bowes Knott, issued Apr. 8, 1952, 3,206,313 of Henry D. Porter, Thomas H. James and Wesley G. Lowe, issued Sept. 14, 1965, and 3,447,927 of Robert E. Bacon and Jean F. Barbier, issued June 3, 1969. The emulsions may be regular-grain emulsions such as the type described by Klein and Moisar in J. Photogr. Sci., Vol. 12, No. 5, Sept./Oct. 1964, pp. 242-251. If desired, mixtures of surface and internal image emulsions may be used as described in U.S. Pat. No. 2,996,382 of George W. Luckey and John C. Hoppe, issued Aug. 15, 1961.

In the production of black-and-white selection negatives or positives preferably silver halide emulsion materials are used that can yield high-contrast line or screen images with so-called lith-developers on the basis of hydroquinone as described e.g. in U.S. Pat. Nos. 3,972,719 and 4,081,280. The photographic materials used in conjunction with a lith-developer comprise preferably at least 50 mole % of silver chloride, the balance, if any, being bromide and optionally minor amounts of iodide (less than 5 mole %).

Apart from negative working silver halide emulsions that are preferred for their high light sensitivity, direct positive silver halide emulsions may be used that produce a positive silver image and a corresponding imagewise distribution of developing agent oxidation products during their development. For example those direct positive silver halide emulsions are considered wherein by exposure or by a chemical treatment a developable fog has been produced, which is destroyed imagewise during the imagewise exposure when certain conditions are fulfilled. In the unexposed areas the fog is maintained so that during the subsequent development a direct positive silver image is obtained and in correspondence therewith an imagewise distribution of oxidized hardening developing agent.

For example, direct positive emulsions of the type described in P. J. Hillson, U.S. Pat. No. 3,062,651, may be utilized to obtain direct positive images. In emulsions of this type, a nonhardening fogging agent such as stannous chloride, formamidine sulfinic acid, or the like is used.

More details about composition, preparation and coating of silver halide emulsions are described, e.g., in Product Licensing Index, Vol. 92, December 1971, publication 9232, p. 107–109.

The emulsions can be chemically sensitized, e.g. by adding sulphur-containing compounds, e.g. allyl isothiocyanate, allyl thiourea, sodium thiosulphate and the like, during the chemical ripening stage. Also reducing agents, e.g. the tin compounds described in the Belgian Patent Specifications Nos. 493,464 and 568,687, and polyamines such as diethylenetriamine or derivatives of aminomethane-sulphonic acid, e.g. according to the Belgian Patent Specification No. 547,323, can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

Further it is possible to sensitize the emulsions with polyalkylene oxide derivatives, e.g. with polyethylene oxide having a molecular weight between 1000 and 20,000, or with condensation products of alkylene oxides and aliphatic alcohols, glycols, cyclic dehydration products of hexitols, alkylsubstituted phenols, aliphatic carboxylic acids, aliphatic amines, aliphatic diamines and amides. The condensation products have a molecular weight of at least 700, preferably of more than 1000. For obtaining special effects these sensitizers of course can be combined with each other as described in Belgian Patent Specification No. 537,278 filed Apr. 12, 1955 and UK Patent Specification No. 727,982.

The silver halide emulsions may contain the usual stabilizers, e.g. homopolar or salt-like compounds of mercury with aromatic or heterocyclic rings such as mercaptotriazoles, simple mercury salts, sulphonium mercury double salts and other mercury compounds. Other suitable stabilizers are azaindenes, preferably tetra- or penta-azaindenes, especially those substituted with hydroxyl or amino groups. Compounds of this kind are described by BIRR in Z. Wiss. Photogr. Photophys. Photochem. 47, 2–27 (1952). Still other suitable sensitizers are amount others heterocyclic mercapto compounds, e.g. phenylmercaptotetrazole, quaternary benzothiazole derivatives, benzotriazole and the like.

The spectral photosensitivity of the silver halide has to be compatible with the spectral composition of the scanning writing light and for a proper spectral sensitization the usual mono- or polymethine dyes such as acidic or basic cyanines, hemicyanines, oxonols, hemioxonols, styryl dyes or others, also tri- or polynuclear methine dyes, e.g. rhodacyanines or neocyanines may be used. Such spectral sensitizers are described, e.g., by F. M. HAMER in "The Cyanine Dyes and Related Compounds" (1964) Interscience Publishers, John Wiley & Sons, New York.

The hardening development proceeds with commonly used hardening developing agents, also called tanning developing agents for effecting the development of the silver halide and producing oxidized developing agent acting as hardening agent for the hydrophilic colloid binder such as gelatin. Examples of suitable hardening developing agents are: 1,4-dihydroxy benzene compounds such as hydroquinone, chlorohydroquinone, bromohydroquinone, toluhydroquinone, morpholinemethyl hydroquinone, sulfohydroquinone and the like.

The developing agent may be incorporated in the silver halide emulsion material in the silver halide emulsion layer or in a non-silver halide containing layer adjacent thereto and/or in the non-photosensitive hardenable pigment containing gelatin binder layer so that development can be attained by using an alkaline activator liquid.

According to a special embodiment the layer containing photosensitive silver halide is combined with an adjacent hydrophilic colloid layer containing an auxiliary developing agent forming a superadditive developing system with the hardening developing agent that is incorporated in the silver halide emulsion layer.

Typical activator baths for a hardening developable photographic silver halide emulsion material comprise, for example, an aqueous solution of an alkaline material, such as sodium carbonate, sodium hydroxide, potassium carbonate, potassium hydroxide, mixtures of sodium hydroxide and sodium sulfite, etc. A suitable activator bath comprises e.g. about 2 percent by weight of sodium hydroxide and 0.5 percent by weight of sodium sulfite.

It will be appreciated that an auxiliary developing agent can be used along with a hydroquinone developing agent in order to improve the speed without disadvantageously affecting the wash-off processing of the invention. Typical auxiliary developing agents include 3-pyrazolidinone developing agents, e.g. 1-phenyl-3-pyrzolidinone, 1-phenyl-4,4-dimethyl-3-pyrazolidinone, 1-phenyl-4-methyl-4'-hydroxymethyl-3-pyrazolidinone and N-methyl-p-aminophenol sulphate.

Said auxiliary developing agents or a mixture thereof may be incorporated in the photographic material and/or in the non-photosensitive hardenable pigment containing gelatin binder layer and/or in the developing liquid in which the hardening developing agent may be absent when using an alkaline activator bath.

The hardening development and the simultaneous transfer of oxidized hardening developing agent from the exposed photographic material into the hardenable coloured layer may proceed advantageously in a common silver complex diffusion transfer reversal (DTR-) apparatus, wherein after moistening the photographic material with developer or activator liquid the contacting with the hardenable material, that serves as receiving material for the oxidized hardening developer, proceeds between rollers. Such apparatus is commercially available under the trade name COPYPROOF of Agfa-Gevaert NV. Belgium.

A detailed description is hereinafter set forth of a composition and structure of a non-photosensitive material containing a pigmented hardenable gelatin containing layer used in the production of a multicolour image according to the present invention.

A coating composition is prepared containing gelatin dissolved in water wherein the selected pigment is dispersed in a concentration to yield after coating and drying a layer having an optical density in the wavelength range of maximal absorption of at least 0.4. The coating composition contains preferably at least 50% by weight of gelatin in respect of the pigment particles and a proper amount of plasticizing agent and a wateratracting compound, e.g. glycerol to give the coating a sufficient adherence to its temporary support and to enable its easy wet (aqueous) stripping off from the temporary support, e.g. an unsubbed cellulose triacetate or polyethylene terephthalate support.

The coating contains preferably 0.5 to 10 g of gelatin per sq.m.

A second coating, the so-called top-layer, the composition of which is identical to the foregoing, except that no pigment is present, is coated on te first one. The second coating contains preferably 0.2 to 5 g of gelatin per sq.m.

The second coating forms with the underlying pigmented coating one hardenable double layer firmly bound together, in other words a "composite layer" which can be transferred as a whole from the temporary support to the permanent support.

A set of materials each containing such a composite layer is preferably used for preparing a multicolour "colour proofing image". A usual set contains yellow, magenta, cyan, and black pigment coatings on separate cellulose triacetate supports.

The permanent support, e.g. a polyethylene terephthalate support, is successively coated with a first subbing layer on the basis of a copolymer containing hydrophobic and hydrophilic structural units in a suitable ratio and a second subbing layer, which is more hydrophilic than the first one and contains gelatin, a hydrophobic latex polymer and a white pigment, e.g, titanium dioxide particles, for conferring an opaque aspect to the support.

The preparation of multicolour "colour proof" then proceeds according to an embodiment as follows.

To said permanent support subbed as described above a cyan composite layer is transferred by pressing the surface of the subbing layer of the permanent support into contact with the composite layer in the presence of an aqueous liquid and peeling off the temporary cellulose triacetate support.

The transfer can be carried out in an apparatus, in which the materials involved are pressed together between rollers.

An apparatus particularly suitable for use in transferring a hydrophilic colloid layer from a temporary support to a permanent support comprises a pair of cooperating pressure rollers and means for driving said rollers, a first platform for supporting the wetted permanent support prior to its engagement by said pressure rollers, said platform in order to reduce frictional contact having a corrugated structure to make discontinuous contact with the permanent support when this is placed thereon, a second platform arranged over and separated from the first surface for supporting at least the leading part of the temporary support to keep said temporary support separated from the wetted permanent support when this is located on the first platform, the forward ends of both said platforms being disposed proximate to the nip of the pressure rollers so that the supports as they are advanced are gripped by said rollers and progressively pressed together. Before arriving on said first platform the permanent support is wetted with an aqueous liquid, preferably plain water.

The transfer of oxidized developing agent into the coloured materials proceeds normally within a contact time of 15 to 60 s in a temperature range of 18° to 25° C.

Wash-off of non-hardened portions proceeds without mechanical rubbing by means of running water at a temperature preferably between 30° and 50° C. Excess of liquid is preferably removed by squeezing the relief between two smooth soft rollers, e.g. rubber rollers.

In successive order the same steps are carried out for the yellow, magenta, and black pigmented composite layers, which prior to their imagewise hardening by imagewise reception of oxidized developing agent in register from their corresponding photographic material, are transferred onto the same permanent support carrying already the cyan pigment resist. However, the order wherein the colour relief images are made can be chosen arbitrarily.

In a particular case of four colour printing the cyan composite layer is first applied to the permanent support and is wash-off processed after the imagewise transfer therein of oxidized hardening developing agent from a developing black-and-white silver halide emulsion material that had been scanningwise exposed by the red filter information of the multicolour original.

The permanent support carrying the first relief image (the cyan relief image) is pressed between rollers while in contact with another coloured composite layer, e.g. the yellow one, and after a few seconds of contact the temporary support is peeled off, thus overall transferring the yellow composite layer on the cyan part relief image produced already.

The obtained multilayer colloid pattern can be protected by a transparent resin topcoat, which according to a preferred embodiment is applied by spraying. A suitable "spray-cover" consists of polyisobutyl methacrylate.

The production of a multicolour proof is illustrated in more detail in the following examples. The percentages are by weight if not otherwise indicated.

EXAMPLE 1

Composition of the photographic material

The photographic material contained on a film support a hardened gelatin-silver halide emulsion layer covered by a protective layer incorporating a hardening developing agent.

The silver halide emulsion layer was applied to a subbed polyester support at a silver halide coverage equivalent with 4 g of silver per sq.m and a gelatin coverage of 3 g per sq.m. It contained silver chloride-bromide-iodide grains (97.8/2/0.2 mole %) made spectrally sensitive to 488 nm argon ion laser light.

The protective layer was a gelatin layer hardened with formaldehyde containing per sq.m 0.9 g of gelatin and 0.035 g of hydroquinone.

Preparation of the coloured gelatin containing materials

On separate temporary supports of unsubbed cellulose triacetate having a thickness of 0.1 mm of following coloured gelatin containing layers (i), (ii), (iii) and (iv) were applied.

(i) a cyan pigment gelatin binder layer containing 0.2 g of glycerol as softening agent and FLEXONYL BLUE (C.I. Index Nr. 74,160) as cyan pigment in order to obtain a spectral density of about 1.4 in the red region of the visible spectrum. The gelatin coverage was 1.4 g per sq.m.

Magenta (ii), yellow (iii) and black (iv) pigment coatings were applied as defined for the cyan pigmented coating above. The magenta pigment was HELIOECHTCARMIN BB TEIG (Colour Index Nr. 12,485) and the yellow pigment as HELIOECHTGELB GRN 7476 (Colour Index Nr. 21,100). Said pigments were used in an amount sufficient to obtain a spectral density of about 1.4 in their main spectral absorption range. In the black pigment coating carbon black was used to reach an optical density of 1.6.

The scanningwise exposure

The scanningwise exposure of the photographic material proceeded on a commercial scanner operating with an argon ion laser source emitting at 488 nm.

Four pieces of the photographic material having DIN A4 format were adjacently arranged on the scanner drum, so that in a single step all the materials were exposed without stopping the rotation of the drum.

The transfer of the coloured gelatin layer from its temporary support

The cyan pigment coating was transferred from its temporary support onto a permanent support of subbed polyethylene terephthalate as described in U.S. Pat. No. 3,642,474. The transfer proceeded by soaking the permanent support in water for 30 s and then pressing it into contact with the cyan pigment gelatin binder layer of (i). By stripping apart the temporary support the cyan pigment layer (i) was left on the permanent support.

The transfer of oxidized developing agent

In the exposed state the first photographic material (exposed to the cyan selection information) was contacted with the aqueous alkaline developing liquid as described hereinafter in order to develop said scanningwise exposed photographic material. The developing photographic material was contacted for 30 s at 20° C. between pressure rollers with the cyan pigment coating which has been transferred from its temporary support onto the permanent support of subbed polyethylene terephthalate.

Composition of the developer bath sodium carbonate—75 g,
sodium sulphite—4.5 g,
sodium thiosulphate—9.2 g,
potassium bromide—1 g,
1-phenyl-5-mercaptotetrazole (1% by weight in ethanol)—2.5 ml,
hydroquinone—3 g,
1-phenyl-3-pyrazolidinone—0.46 g,
water up to—1 l.

The wash-off processing

To obtain a cyan coloured relief image the hardened cyan pigment layer was wash-off processed with a warm (35° C.) water spray. The relief image was dried.

Transfer, hardening and wash-off processing proceeded for the outer pigmented layers in the same way after the transfer from their temporary support to the same permanent support. Said transfer was carried out onto an already previously formed coloured hardened gelatin relief.

EXAMPLE 2

Example 1 was repeated with the difference that the following lith-developer described in U.S. Pat. No. 4,081,280 was used to improve the optical density of the screened selection negatives.

Composition of the developer bath formaldehyde hydrogen sulphite—4.5 g,
potassium metabisulphite—4.25 g,
potassium bromide—2 g,
potassium chloride—6 g,
hydroquinone—15 g,
potassium carbonate—70 g,
boric acid—6 g,
poloxyethylene glycol—(average molecular weight 1,500)—0.3 g,
hydroquinone sulphonic acid—15 g,
water to make—1 liter,
pH adjusted with potassium hydroxide to 9.9.

We claim:

1. A process for forming a line or halftone multicolour colloid pattern which process comprises the following steps in sequence:
   (1) scanningwise exposing a multicolour original to obtain separate red light, green light and blue light output signals, receiving the latter by photon-detectors to produce separate series of electrical signals corresponding to said different light signals, and feeding the separate series of signals thus produced to a computer,
   (2) scanningwise exposing a corresponding number of separate black-and-white photosensitive silver halide emulsion layer materials to a light source controlled by said computer in accordance with the respective series of light signals,
   (3) developing a first one of the exposed silver halide emulsion layer materials with a hardening developing agent, and during such development effecting imagewise migration of oxidized hardening developing agent from the developing emulsion layer to a hardenable non-photosensitive gelatin-containing layer coloured with diffusion-resistant coloured substances, said coloured layer being carried at the time of such migration on a permanent support, to selectively harden regions of the coloured layer, and
   (4) removing the non-hardened regions of the coloured gelatin-containing layer by wash-off or transfer processing to leave a coloured hardened gelatin relief image on the permanent support, or
   (3') developing a first one of the exposed silver halide emulsion layer materials with a hardening developing agent, and during developing effecting imagewise migration of oxidized hardening developing agent from said developing emulsion layer to a hardenable non-photosensitive gelatin-containing layer that is coloured with diffusion-resistant coloured substances and is carried out on a temporary support to selectively harden image regions of the coloured layer, and
   (4') removing the non-hardened regions of the coloured gelatin containing layer by wash-off processing to leave a coloured hardened gelatin relief image on the temporary support and then transferring such residual relief image onto a permanent support by pressing the relief image while dry, and in the presence of heat if needed, against the permanent support and removing the temporary support, and
   (5) repeating steps (3) and (4) or (3') and (4') with at least another one of said scanningwise exposed photographic emulsion layer materials and a differently coloured non-light sensitive gelatin-containing layer originally carried on a temporary support and transferred to said permanent support on top of the initial relief image thereon in advance of migration of such oxidized developing agent from such other emulsion layer material to add for each repetition another coloured relief image to said permanent support in registration with the preceding coloured relief image thereon.

2. The process of claim 1 wherein the coloured non-light sensitive gelatin-containing layer receiving oxidized hardening developing agent by migration from said first one of said emulsion materials is originally carried on a temporary support and is transferred to said permanent support in advance of the migration of oxidized developing agent thereto.

3. The process of claim 1 wherein the coloured non-light sensitive gelatin-containing layer receiving oxidized hardening developing agent by migration from said first one of said exposed emulsion layers is originally formed on said permanent support.

4. Process according to claim 1, wherein the permanent support is less hydrophobic than each such temporary support and the transfer of the hardened gelatin relief image from such temporary support is effected by pressing the permanent support in the presence of an aqueous liquid against the coloured hardenable non-photosensitive gelatin-containing layer while carried on such temporary support and then removing the temporary support, thus leaving the hardenable gelatin relief image on said permanent support.

5. Process according to claim 1, wherein the scanning-wise exposure of the photosensitive silver halide materials proceeds from the front side to produce a reverse reading exposure image in such materials.

6. Process according to claim 1, wherein each silver halide emulsion material contains a hardening developing agent.

7. Process according to claim 1, wherein the silver halide of each silver halide emulsion layer comprises at least 50 mole % of silver chloride, the balance, if any being bromide and/or less than 5 mole % of iodide.

8. Process according to claim 1, wherein each hardenable non-photosensitive gelatin-containing layer coloured with diffusion-resistant coloured substances is over-coated with a hydrophilic colloid top layer free of such coloured substances.

9. Process according to claim 8, wherein the combined thickness of each top layer and underlying colour layer is in the range of 1 μm and 15 μm and contain 0.5 to 10 g of gelatin per sq.m.

10. Process according to claim 1, wherein the temporary support is a cellulose triacetate sheet.

11. Process according to claim 1, wherein the permanent support is a polyethylene terephthalate sheet carrying a subbing layer to improve the adherence to said gelatin-containing layer.

* * * * *